US006696833B2

United States Patent
Hong et al.

(10) Patent No.: US 6,696,833 B2
(45) Date of Patent: Feb. 24, 2004

(54) LORENTZ FORCE MICROSCOPE AND METHOD OF MEASURING MAGNETIC DOMAIN USING LORENTZ FORCE

(75) Inventors: Seung-bum Hong, Kyungki-do (KR); Jong Up Jeon, Kyungki-do (KR); Hyun-jung Shin, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 10/138,643

(22) Filed: May 6, 2002

(65) Prior Publication Data

US 2003/0107372 A1 Jun. 12, 2003

(30) Foreign Application Priority Data

Dec. 8, 2001 (KR) ........................................ 2001-77578

(51) Int. Cl.[7] ............................................. G01R 33/02
(52) U.S. Cl. ...................................... 324/244; 324/260
(58) Field of Search ................................. 324/244, 259, 324/260, 261, 226

(56) References Cited

U.S. PATENT DOCUMENTS

| | | | | |
|---|---|---|---|---|
| 4,992,659 A | * | 2/1991 | Abraham et al. | 250/306 |
| 5,313,451 A | * | 5/1994 | Yagi et al. | 369/126 |
| 5,481,527 A | * | 1/1996 | Kasanuki et al. | 369/126 |
| 5,793,743 A | * | 8/1998 | Duerig et al. | 369/126 |
| 6,147,959 A | * | 11/2000 | Ohyama | 369/126 |

* cited by examiner

Primary Examiner—N. Le
Assistant Examiner—Reena Aurora
(74) Attorney, Agent, or Firm—Burns, Doane, Swecker & Mathis, LLP

(57) ABSTRACT

A Lorentz force microscope and a method of measuring magnetic domains using Lorentz force are provided. The Lorentz force microscope includes: a conductive probe which is actuated by Lorentz force occurring due to the interaction between a magnetic field of the magnetic medium and current applied into the magnetic field; a bottom electrode which is prepared on one side of the magnetic medium, for charging the magnetic field with electricity; a scanner for supporting the magnetic medium on which the bottom electrode is prepared and actuating the magnetic medium when the conductive probe opposite to a record of the magnetic medium scans the record of the magnetic medium; and an information detector for controlling the scanner and detecting information on magnetization of the magnetic medium from motion components of the conductive probe. Directions of Lorentz force which is applied to the conductive probe are sensed in a state that the conductive probe contacts or does not contact the magnetic medium to detect magnetization directions of the magnetic domains. Thus, a magnetic domain distribution map having improved resolution can be obtained.

11 Claims, 6 Drawing Sheets

LORENTZ FORCE MICROSCOPE AND METHOD OF MEASURING MAGNETIC DOMAIN USING LORENTZ FORCE

Priority is claimed to Patent Application Number 2001-77578 filed in Rep. of Korea on Dec. 8, 2001, herein incorporated by reference.

BACKGROUND OF THE INVENTION

1. Field of the Invention

The present invention relates to a microscope for observing a magnetic domain and a method of measuring a magnetic domain, and more particularly, to a Lorentz force microscope and a method of measuring a magnetic domain using Lorentz force.

2. Description of the Related Art

An apparatus for measuring a magnetization state of a micro magnetic domain of a magnetic medium is currently needed in the development of the magnetic medium for storing highly integrated and high density information.

A microscope for observing an existing magnetic medium includes an optical magnetic microscope, a near-field optical microscope, a scanning electron microscope (SEM), magnetic force microscope (MFM), and the like. Among these, the MFM is mainly used to detect the magnetization of a micro magnetic domain and obtain high resolution.

The MFM is an apparatus for detecting the magnetization direction of a magnetic domain of a recording medium using a probe which is coated with a magnetic substance. The MFM operates in a state that it does not contact the magnetic domain. A cantilever of the MFM is affected by an atomic force and a magnetic force at the same time. Atomic force is a short-range force and increases exponentially as the tip-sample distance decreases whereas magnetic force is a long range one and smoothly decreases as tip-sample distance increases. Therefore, topography information is dominantly obtained at short tip-sample distances while magnetic force image is dominantly acquired at long tip-sample distances. As a result, information on the magnetization direction of the magnetic domain of the recording medium can be obtained by scanning the tip both at short and long distances followed by subtracting the two images so obtained.

FIG. 1 is a schematic diagram of a MFM. Referring to FIG. 1, a probe 11 of a MFM 10 is coated with a magnetic material 13. The probe 11 is connected to a cantilever (not shown) to move up and down depending on the direction of each magnetic domain of a magnetic medium 15. If the tip coating material has downward magnetization direction, the cantilever deflection will be upward when the magnetization of a magnetic domain is in up (↑) direction whereas it will be downward when the magnetization of a magnetic domain is in a down (↓) direction. The magnetization map of the magnetic domains of the recording medium 15 can be detected by stacking the line profile of the cantilever deflection.

However, since a probe of a conventional magnetic medium is coated with a magnetic material, the radius of the probe is large. Also, since the probe reproduces information from the recording medium in a state that it does not contact the recording medium, there is a limit in resolution. Further, the probe may be demagnetized and thus the reliability of the image may decrease.

SUMMARY OF THE INVENTION

To solve the above-described problems, it is an object of the present invention to provide a microscope for reading magnetization directions of magnetic domains of a recording medium in a state that the microscope contacts or does not contact the recording medium to accurately detect the magnetization directions.

Accordingly, to achieve the above object, there is provided a Lorentz force microscope for measuring magnetic domains of a magnetic medium. The Lorentz force microscope includes: a conductive probe which is actuated by Lorentz force occurring due to the interaction between a magnetic field of the magnetic medium and current applied into the magnetic field; a bottom electrode which is prepared on one side of the magnetic medium, for charging the magnetic field with electricity; a scanner for supporting the magnetic medium on which the bottom electrode is prepared and actuating the magnetic medium so that the conductive probe opposite to a record of the magnetic medium scans the record of the magnetic medium; and an information detector for controlling the scanner and detecting information on magnetization of the magnetic medium from motion components of the conductive probe.

The information detector includes: a power supply for supplying power to the conductive probe and the bottom electrode; a light source for radiating light onto the conductive probe to sense the motion components of the conductive probe; a photo diode for converting light reflected on the conductive probe into a photoelectric signal to output a signal with respect to the motion components of the conductive probe; an information output unit for outputting information on magnetization directions of the magnetic medium from the signal output from the photo detector; and a controller for controlling the scanner so that the conductive probe scans the record of the magnetic medium.

It is preferable that the power supply supplies alternating current.

The conductive probe has a tip with a radius of 50 nm or less. The conductive probe is conic, pyramidic, or cylindrical.

To achieve the above object, there is provided a method of measuring magnetic domains using a Lorentz force microscope having a conductive probe which is positioned over a magnetic medium and a bottom electrode which is prepared on one side of the magnetic medium and charges the magnetic medium with electricity. Current is applied to the conductive probe and the bottom electrode when the conductive probe scans a record of the magnetic medium. The conductive probe is oscillated by Lorentz force due to the interaction between the current and a magnetic field of the magnetic medium to scan the record of the magnetic medium. Magnetization directions of the magnetic domains of the magnetic medium are detected from motion components of the conductive probe.

When detecting the magnetization directions of the magnetic domains of the magnetic medium, light is radiated onto the conductive probe and light reflected on the conductive probe is received. Next, directions of Lorentz force which is applied to the conductive probe are detected from the received light signal, and then magnetization directions of the magnetic domains of the magnetic medium are determined based on the detected directions of Lorentz force.

In a Lorentz force microscope and a method of measuring the magnetic domains using Lorentz force, the magnetic domains can be imaged in a state that a probe contacts a magnetic medium. Thus, a magnetization distribution map having improved resolution can be provided. Lorentz force which is horizontal force having low atomic force and crosstalk can be measured. Thus, a magnetization distribution map, which is distinguished from image degree of a record, can be obtained.

Lorentz force is the force that charged particles experience when they move in a magnetic field. In particular, if an electric field and the magnetic field exist at the same time, the force which is applied to the moving charged particles can be represented by Lorentz force equation as seen in equation 1:

$$\vec{F} = Q(\vec{E} + (\vec{v} \times \vec{B})) \quad (1)$$

Depending on the direction of the current (or charge movement) and magnetic field, Lorentz force can be adjusted to any direction. Therefore, the resulting Lorentz force can be easily identified by properly designing the current flow (or charge movement) above the magnetic media. For example, if the current flows through the tip and interacts with the surface parallel magnetic field generated from the magnetic medium, the Lorentz force will be normal to the plane surface defined by the current direction and the magnetic field which will either cause torsion or normal force on the probe.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
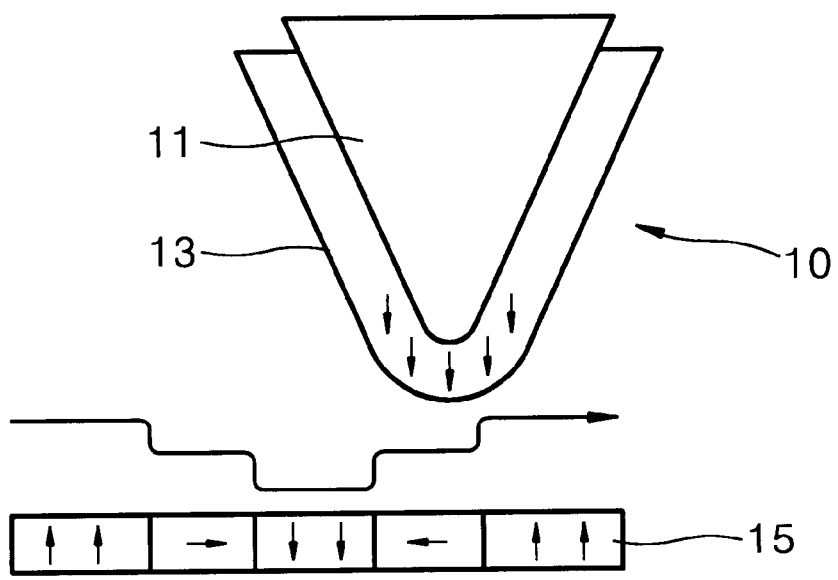
FIG. 1 is a schematic view of a conventional magnetic force microscope (MFM)

Hereinafter, a Lorentz force microscope and embodiments of a method of measuring magnetic domains using Lorentz force according to the present invention will be described in detail with the attached drawings. Here, like reference numerals in the drawings denote the same members. In the drawings, the thicknesses of regions are exaggerated for clarity.

Figure 2:
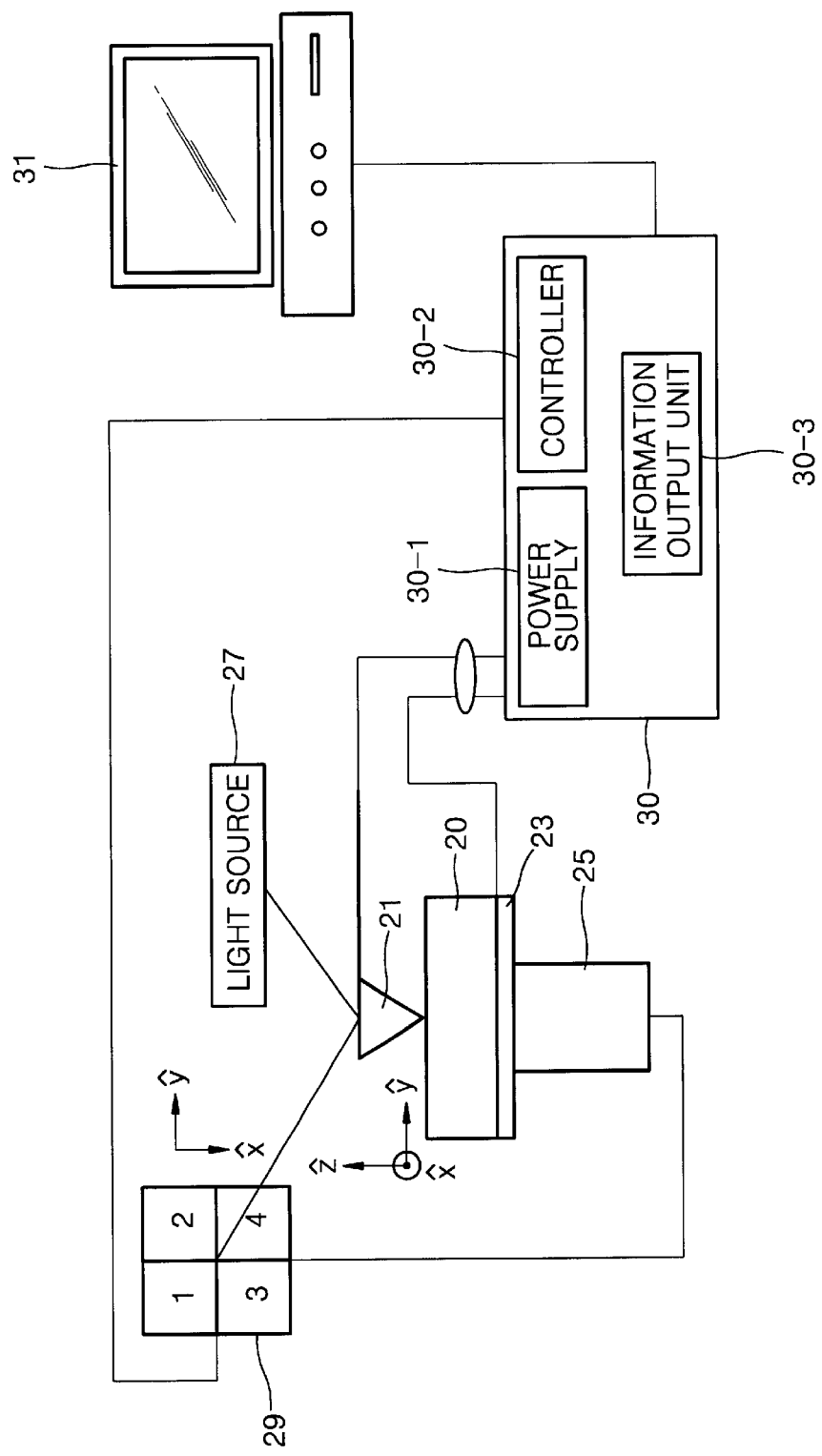
FIG. 2 is a configuration diagram of a Lorentz force microscope according to an embodiment of the present invention.

FIG. 2 is a configuration diagram of a Lorentz force microscope according to an embodiment of the present invention. Referring to FIG. 2, the Lorentz force microscope according to the embodiment of the present invention includes a conductive probe 21, a bottom electrode 23, a scanner 25, and an information detector 30. Here, the conductive probe 21 is positioned on a magnetic medium 20 to detect magnetization directions of magnetic domains distributed on a record of a magnetic medium 20. The bottom electrode 23 is prepared on one side of the magnetic medium 20 to charge the magnetic medium 20 with electricity. The scanner 25 supports the magnetic medium 20 on the bottom electrode 23 and actuates the magnetic medium 20 so that the conductive probe 21 opposite to the record of the magnetic medium 20 scans the record of the magnetic medium 20. The information detector 30 controls the scanner 25 and detects information on magnetization of the magnetic domains of the magnetic medium 20 from the motion components of the conductive probe 21.

The magnetic medium 20 consists of a ferromagnetic material for example on which many domains are arranged. A magnetic domain is a domain on which dipole moments of atoms are arranged parallel to each other and whose shape and size depend on size, shape, kind, and magnetic hysteresis of a material. The size of the magnetic domain ranges from several tens of nanometers to several centimeters. A technique for accurately measuring magnetic directions of magnetic domains is needed to develop a highly integrated magnetic medium.

The conductive probe 21, whose radius is 50 nm or less, is preferably conic, pyramidic, or cylindrical. The conductive probe 21 is affected by a force in a predetermined direction due to Lorentz force occurring due to the interaction between a magnetic field of the magnetic medium 20 and current applied to the conductive probe 21 when scanning the record of the magnetic medium 20 in a state that it contacts or does not contact the magnetic medium 20. The magnetic field of the magnetic medium 20 is formed by the magnetization of the magnetic domains of the magnetic medium 20. Thus, the direction of the magnetic field is changed if the direction of the magnetization is changed. The direction of Lorentz force is changed by the direction of the magnetic field and thus a motion direction of the conductive probe 21 is changed. The direction of the magnetic field can be estimated from the motion components of the conductive probe 21 and suggests the magnetization direction of the magnetic domains.

The bottom electrode 23 receives an electric signal from a power supply 30-1 of the information detector 30 together with the conductive probe 21. The power supply 30-1 outputs alternating current (AC) so the phase of a reference AC signal is compared with the phase of the oscillation signal of the conductive probe 21 by Lorentz force and then output the magnetization directions of the magnetic domains.

A method of comparing phase difference between an output signal and a motion signal of a probe includes a lock-in technique having good signal-to-noise (S/N) ratio. The lock-in technique outputs Acosφ (A is the amplitude of a signal and φ is the phase of the signal) from the product of two signals and outputs Asinφ from the product of a signal which is 90 degrees out of phase with a reference signal and the motion signal of the probe using a dual phase lock method. As a result, amplitude and phase are separately measured.

The scanner 25 supports the magnetic medium 20 on which the bottom electrode 23 is prepared and actuates the magnetic medium 20 together with the bottom electrode 23 so that the conductive probe 21 scans the record of the magnetic medium 20. The scanner 25 actuates the bottom electrode 23 in X-axis, Y-axis, and Z-axis directions. The scanner 25 receives a feedback signal from a controller 30-2 of the information detector 30 to be actuated.

The information detector 30 includes the power supply 30-1, a light source 27, a photo diode 29, and an information output unit 30-3. Here, the power supply 30-1 supplies AC power between the conductive probe 21 and the bottom electrode 23. The light source 27 injects light onto the conductive probe 21 to detect motion components of the conductive probe 21. The photo diode 29 receives light reflected on the conductive probe 21 to detect the motion components of the conductive probe 21. The information output unit 30-3 outputs information on a magnetization direction of a specific magnetic domain of the magnetic medium 20 from the photo diode 29.

The power supply 30-1 supplies the conductive probe 21 and the bottom electrode 23 with power whose current is preferably AC. The motion components of the conductive probe 21 due to Lorentz force are detected as described above so that magnetization directions of the magnetic domains constituting the record of the magnetic medium 20 are sensed by comparing phase shift of an oscillation direction of the motion components with phase of a reference AC signal.

The light source 27 is a general laser light source which radiates light onto the conductive probe 21 to detect the motion components of the conductive probe 21.

The photo diode 29 receives light reflected on the conductive probe 21 and coverts light into a photoelectric signal to output an electric signal with respect to the motion components of the conductive probe 21. The photo diode 29 is preferably a quadruple position sensitive photo diode as shown in FIG. 2.

For example, the conductive probe 21 is affected by Lorentz force in an X-axis direction if a magnetic field is in a Y-axis direction and current is in a Z-axis direction. In this case, light reflected on the conductive probe 21 is condensed on the photo diode 29, which is split into fourth parts. The difference between the light-receiving amount of parts 1 and 2 and the light-receiving amount of parts 3 and 4 is calculated. Here, the light-receiving amount of 1 plus 2 is smaller than the light-receiving amount of 3 plus 4 and thus the conductive probe 21 moves in the X-axis direction.

Here, if the difference between the sum of the light-receiving amounts of parts 1 and 3 and the sum of the light-receiving amounts of parts 2 and 4 is calculated, the distance of the motion of the conductive probe 21 in the Z-axis direction on the record of the magnetic medium 20 can be obtained. Thus, the scanner 25 is controlled in the Z-axis direction depending on a signal ((1+3)−(2+4)) so that the conductive probe 21 scans the record of the magnetic medium 20 in the Z-axis direction with the maintenance of a predetermined distance between the conductive probe 21 and the surface of the magnetic medium 20.

The information output unit 30-3 can detect information on the magnetization directions of the magnetic domains of the magnetic medium 20 from information on the motion components of the conductive probe 21 of the photo diode 29.

Figure 3:
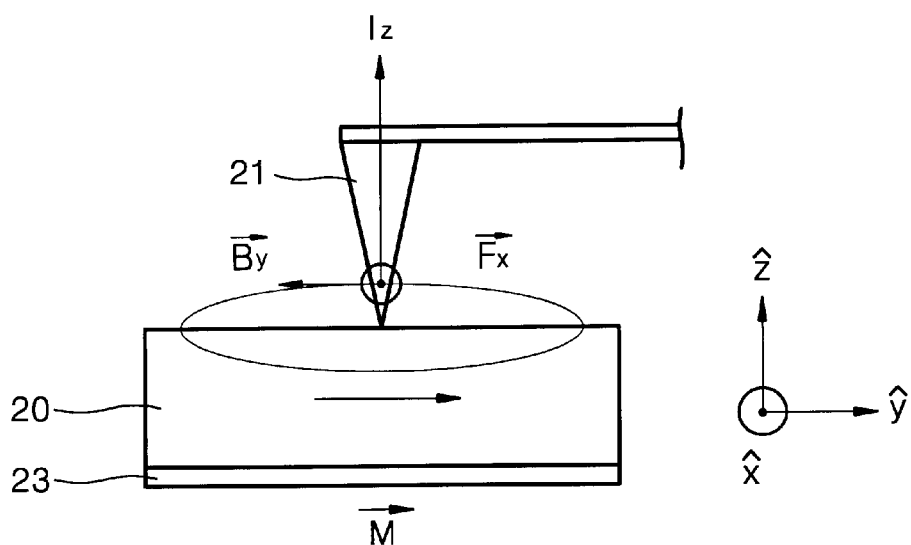
FIG. 3 is a schematic view explaining a method of measuring magnetic domains using Lorentz force according to a first embodiment of the present invention when a magnetization of a magnetic medium is in a Y-axis direction.
Figure 4:
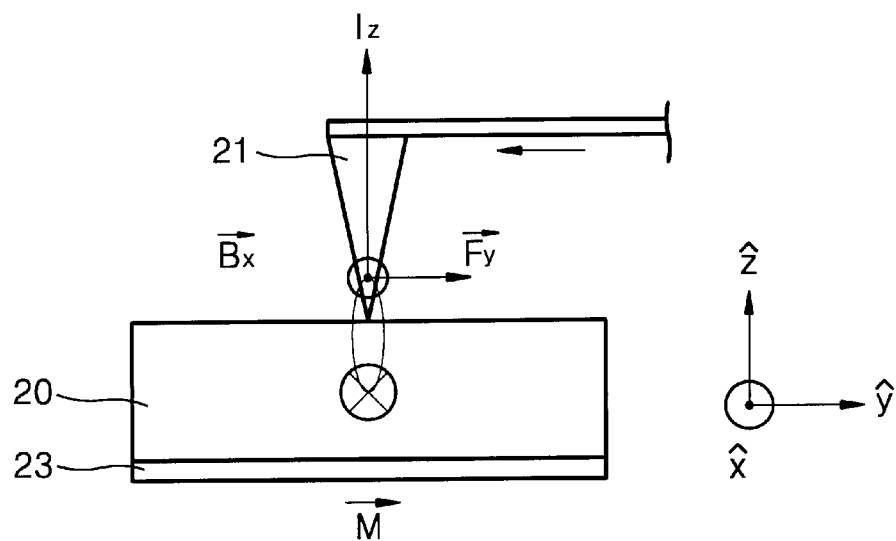
FIG. 4 is a schematic view explaining a method of measuring magnetic domains using Lorentz force according to the first embodiment of the present invention when a magnetization of a recording medium is in an X-axis direction.
Figure 5:
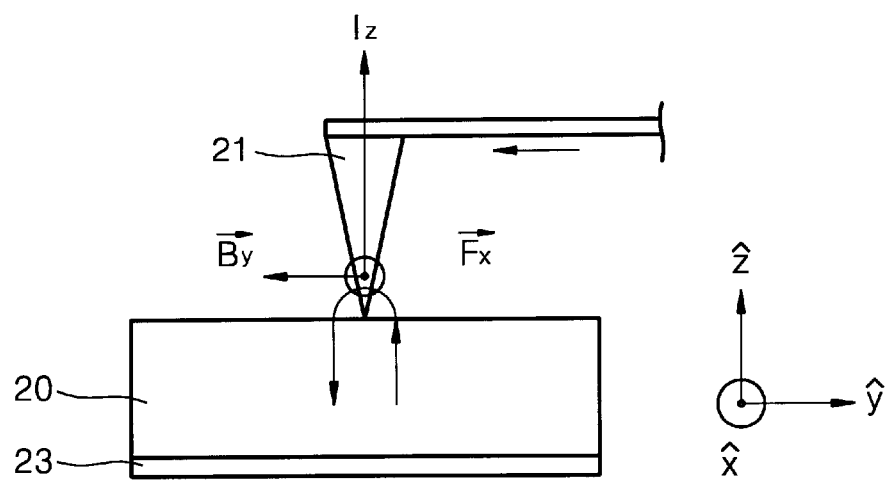
FIG. 5 is a schematic view explaining a method of measuring magnetic domains using Lorentz force according to the first embodiment of the present invention when a magnetization of a recording medium is in a Z-axis direction.

FIGS. 3 through 5 are views explaining a method of detecting directions of Lorentz force from specific actuation directions of the conductive probe 21 and magnetization directions from the directions of Lorentz force.

A method of measuring magnetic domains using Lorentz force according to a first embodiment of the present invention includes a first step of applying current to the conductive probe 21 for scanning the record of the magnetic medium 20 and the bottom electrode 23, a second step of actuating the conductive probe 21 in predetermined directions by Lorentz force occurring due to the interaction between current and the magnetic field of the magnetic medium 20, and a third step of detecting magnetization directions of the magnetic domains of the magnetic medium 20 from the actuation directions of the conductive probe 21.

The third step includes a step of radiating light onto the conductive probe 21 and receiving light reflected on the conductive probe 21, a step of detecting directions of Lorentz force which is applied to the conductive probe 21 from a received light signal, and a step of determining magnetization directions of the magnetic domains of the magnetic medium 20 based on the detected directions of Lorentz force.

Referring to FIG. 3, it is seen that the direction of a magnetic field above the record of the magnetic medium 20 is in a Y-axis direction from a magnetic field loop if the magnetization direction of the magnetic domains of the magnetic medium 20 is in a Y-axis direction. When the magnetic field By is in Y-axis direction and current Iz flowing in the conductive probe 21 is in Z-axis direction, Lorentz force Fx is in X-axis direction as is evident from equation 1. In other words, if the conductive probe 21 is actuated in the X-axis direction, the magnetic domains are magnetized in the Y-axis direction.

Referring to FIG. 4, if the magnetic domains of the magnetic medium 20 are magnetized in X-axis direction, the magnetic field of the record above the magnetic medium 20 is in X-axis direction from the magnetic field loop. When the magnetic field Bx is in the X-axis direction and current Iz flowing in the conductive probe 21 is in the Z-axis direction, Lorentz force Fy is in the Y-axis direction as seen from equation 1. In other words, if the conductive probe 21 is actuated in the Y-axis direction, the magnetic domains are magnetized in the X-axis direction.

Figure 7A:
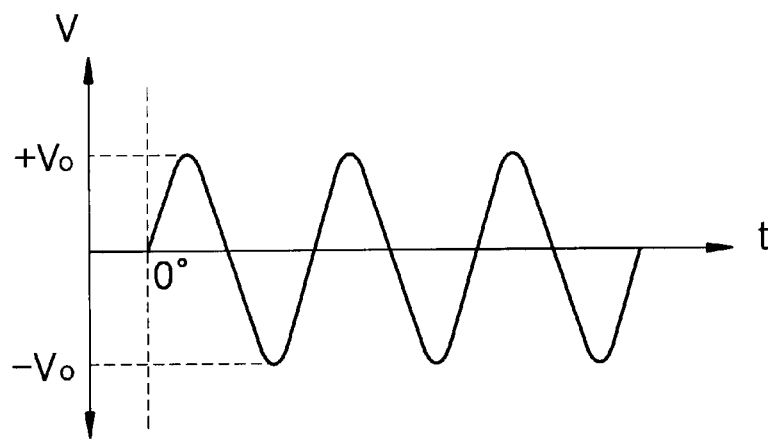
FIGS. 7A through 7D are graphs showing current signals of a power source and phases of oscillation directions of a conductive probe in a method of measuring magnetic domains using Lorentz force according to a second embodiment of the present invention.
Figure 7B:
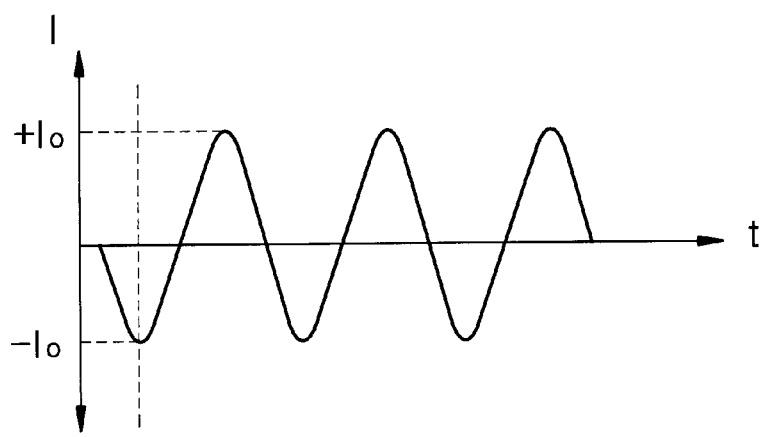
Figure 7C:
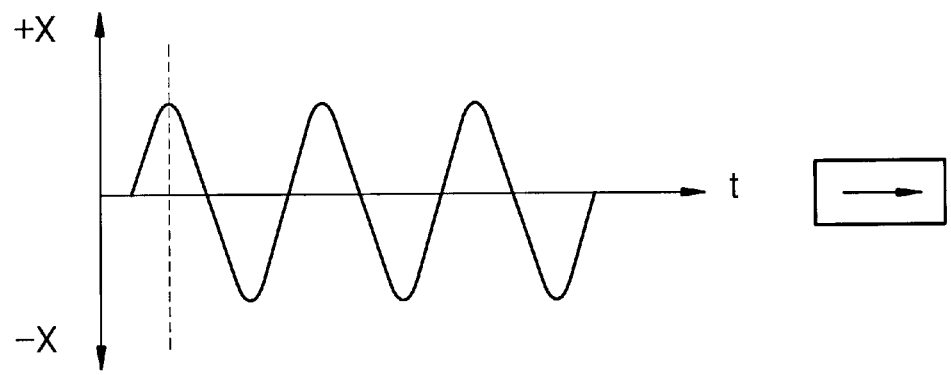
Figure 7D:
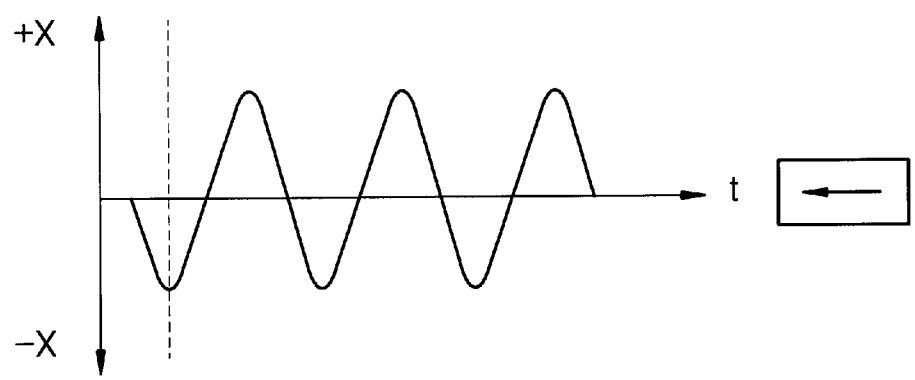

Referring to FIGS. 7A–7D, a voltage applied from the power supply 30-1 has a wave form obtained from equation 2 as shown in FIG. 7A and an AC has a wave form obtained from equation 3 as shown in FIG. 7B. Here, if the magnetic domains are magnetized in Y-axis direction, the amplitude of the oscillation signal of the conductive probe 21 due to Lorentz force shows the maximum value at 0° as shown in FIG. 7C. If the magnetic domains are magnetized in a -Y-axis direction, the amplitude of the oscillation signal of the conductive probe 21 due to Lorentz force shows the minimum value at 0° as shown in FIG. 7D. Thus, the phase difference of 180° occurs between parallel but opposite magnetic domains.

Accordingly, whether a recording medium is a horizontal magnetic recording medium (a magnetic domain having magnetic vectors along X-axis and Y-axis) or a vertical magnetic recording medium (a magnetic domain having a vector along the Z-axis) should be first determined. Thus, magnetization directions can accurately be determined only by motion components of the conductive probe 21.

A method of detecting magnetization directions by comparing phase of an AC signal of power and phase of an oscillation direction of a probe will be described with reference to FIGS. 6 and 7.

A method of measuring magnetic domains using Lorentz force according to a second embodiment of the present invention includes a first step of applying current to the conductive probe 21 and the bottom electrode 23 so that the conductive probe 21 scans the record of the magnetic medium 20, a second step of actuating the conductive probe 21 in predetermined directions due to Lorentz force occurring due to the interaction between the current and the magnetic field of the magnetic medium 20, and a third step of detecting magnetic directions of the magnetic domains of the magnetic medium 20 from an oscillation direction of the conductive probe 21.

The third step includes a step of radiating light onto the conductive probe 21 and receiving light reflected on the conductive probe 21, a step of detecting directions of Lorentz force which is applied to the conductive probe 21 from the received light signal, and a step of comparing phase of current that is applied to the conductive probe 21 with phase of the oscillation direction of the conductive probe 21 to detect magnetic directions of the magnetic domains of the magnetic medium 20.

Figure 6:
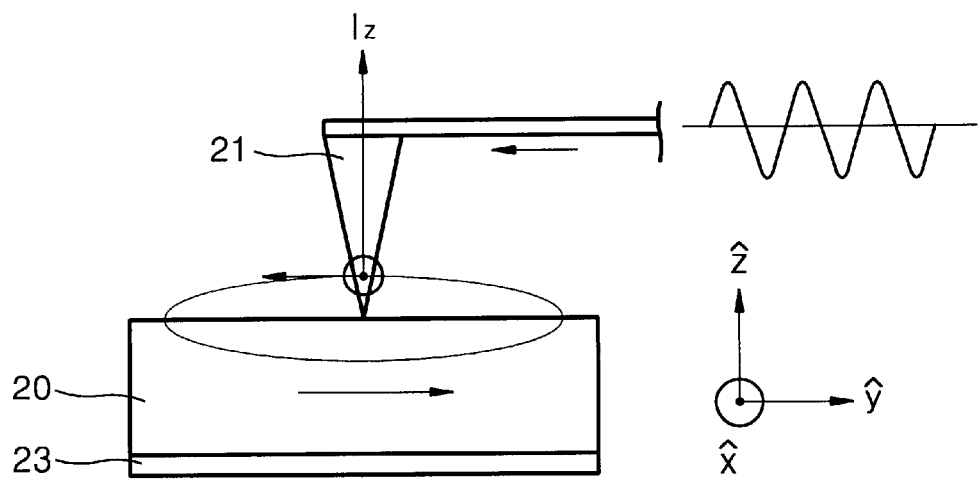
FIG. 6 is a schematic view explaining a method of measuring magnetic domains using Lorentz force according to a second embodiment of the present invention.

As shown in FIGS. 6 and 7, magnetization directions can be accurately determined by comparing phase of an AC signal supplied from the power supply 30-1 and phase of an oscillation direction of the conductive probe 21.

Referring to FIG. 6, if the conductive probe 21 receives an AC and the magnetic domains are magnetized in Y-axis direction, the conductive probe 21 receives Lorentz force in X-axis direction to be oscillated.

Referring to FIG. 7, a voltage applied from the power supply 30-1 has a wave form obtained from equation 2 as shown in FIG. 7A and an AC has a wave form obtained from equation 3 as shown in FIG. 7B. Here, if the magnetic domains are magnetized in Y-axis direction, the amplitude of the oscillation signal of the conductive probe 21 due to Lorentz force shows the maximum value at 0° as shown in FIG. 7C. If the magnetic domains are magnetized in a −Y-axis direction, the amplitude of the oscillation signal of the conductive probe 21 due to Lorentz force shows the minimum value at 0° as shown in FIG. 7D. Thus, the phase difference of 180° occurs between parallel but opposite magnetic domains.

$$V = V_0 \sin \omega t \quad (2)$$

$$I = -I_0 \cos \omega t \quad (3)$$

The phase of the AC signal shown in FIG. 7B is compared with the phase of the conductive probe 21 shown in FIGS. 7C and 7D. If the phases are equal to each other, magnetizations are arranged in a Y-axis direction. If the difference between the phases is 180°, the magnetizations are arranged in a +Y-axis direction.

A microscope using Lorentz force according to an embodiment of the present invention contacts or does not contact a magnetic medium to detect directions of Lorentz force from motion components of a conductive probe. Magnetization directions of magnetic domains can be detected from the directions of Lorentz force. Thus, a magnetization distribution map having improved resolution can be provided.

As described above, in a Lorentz force microscope and a method of measuring magnetic domains using Lorentz force according to the present invention, magnetization directions of the magnetic domains can be detected in a state that a probe contacts or does not contact a magnetic medium using Lorentz force that can be a horizontal force, unlike atomic force. Thus, a magnetization distribution map having improved resolution can be provided.

Many contents have particularly been described in the description, but must be interpreted as an example of a preferred embodiment not as restricting the scope of the present invention.

For example, those skilled in the art can manufacture a conductive probe in various other forms or coat the conductive probe with a wear-resistant thin film to decrease wear rate when the conductive probe contacts a magnetic medium without departing from the spirit and scope of the invention. Thus, the scope of the present invention must be defined by the appended claims not the described embodiments.

What is claimed is:

1. A Lorentz force microscope for measuring magnetic domains of a magnetic medium, the Lorentz force microscope comprising:

a conductive probe which is actuated by Lorentz force occurring due to the interaction between a magnetic field of the magnetic medium and current applied into the magnetic field;

a bottom electrode which is located on one side of the magnetic medium, for charging the magnetic field with electricity;

a scanner supporting the magnetic medium on which the bottom electrode is prepared and actuating the magnetic medium so that the conductive probe opposite to a record of the magnetic medium scans the record of the magnetic medium; and an information detector for controlling the scanner and detecting information on magnetization of the magnetic medium from motion components of the conductive probe.

2. The Lorentz force microscope of claim 1, wherein the information detector comprises:

a power supply for supplying power to the conductive probe and the bottom electrode;

a light source for radiating light onto the conductive probe to sense the motion components of the conductive probe;

a photo diode for converting light reflected on the conductive probe into a photoelectric signal to output a signal with respect to the motion components of the conductive probe;

an information output unit for outputting information on magnetization directions of the magnetic medium from the signal output from the photo detector; and a controller for controlling the scanner so that the conductive probe scans the record of the magnetic medium.

3. The Lorentz force microscope of claim 2, wherein the power supply supplies alternating current.

4. The Lorentz force microscope of claim 3, wherein the conductive probe has a tip with a radius of 50 nm or less.

5. The Lorentz force microscope of claim 4, wherein the conductive probe is one of a conic probe, a pyramidic probe, and a cylindrical probe.

6. The Lorentz force microscope of claim 2, wherein the conductive probe has a tip with a radius of 50 nm or less.

7. The Lorentz force microscope of claim 6, wherein the conductive probe is one of a conic probe, a pyramidic probe, and a cylindrical probe.

8. The Lorentz force microscope of claim 1, wherein said conductive probe touches the magnetic medium during scanning by said scanner.

9. A method of measuring magnetic domains using a Lorentz force microscope having a conductive probe which is positioned over a magnetic medium and a bottom electrode which is prepared on one side of the magnetic medium and charges the magnetic medium with electricity, the method comprising:

(a) applying current to the conductive probe and the bottom electrode in order to charge the magnetic field with electricity when the conductive probe scans a record of the magnetic medium;

(b) oscillating the conductive probe by Lorentz force due to the interaction between the current and a magnetic field of the magnetic medium while scanning the record of the magnetic medium; and (c) detecting magnetization directions of the magnetic domains of the magnetic medium from motion components of the conductive probe.

10. The method of claim 9, wherein step (c) comprises:

radiating light onto the conductive probe and receiving light reflected on the conductive probe;

detecting directions of Lorentz force which is applied to the conductive probe from the received light signal; and determining magnetization directions of the magnetic domains of the magnetic medium based on the detected directions of Lorentz force.

11. The method of claim 9, wherein said conductive probe touches said magnetic medium during scanning.

* * * * *